United States Patent
Escoffier et al.

(10) Patent No.: US 11,056,868 B2
(45) Date of Patent: Jul. 6, 2021

(54) MONITORING ACCESSORY FOR AN ELECTRICAL APPARATUS PROVIDED WITH A CONNECTION TERMINAL

(71) Applicant: TE Connectivity Services GmbH, Schaffhausen (CH)

(72) Inventors: Anna-Line Escoffier, Chassieu (FR); Annie Virlouvet, Chassieu (FR); Laurence Pionchon, Chassieu (FR)

(73) Assignee: TE CONNECTIVITY SERVICES GMBH, Schaffhausen (CH)

( * ) Notice: Subject to any disclaimer, the term of this patent is extended or adjusted under 35 U.S.C. 154(b) by 547 days.

(21) Appl. No.: 15/933,058

(22) Filed: Mar. 22, 2018

(65) Prior Publication Data

US 2018/0287360 A1 Oct. 4, 2018

(30) Foreign Application Priority Data

Mar. 24, 2017 (EP) .................... 17162729

(51) Int. Cl.
*H02G 3/16* (2006.01)
*G01R 21/14* (2006.01)
(Continued)

(52) U.S. Cl.
CPC ............ *H02G 3/16* (2013.01); *G01R 15/181* (2013.01); *G01R 21/14* (2013.01); *H01R 13/533* (2013.01);
(Continued)

(58) Field of Classification Search
CPC ........ H02G 3/16; H02G 15/06; G01R 15/181; G01R 21/14; G01R 19/0092;
(Continued)

(56) References Cited

U.S. PATENT DOCUMENTS

| 4,746,241 A * | 5/1988 | Burbank, III ..... H02J 13/00002 |
| | | 403/344 |
| 2006/0082356 A1 | 4/2006 | Zhang et al. |

(Continued)

FOREIGN PATENT DOCUMENTS

DE     102015113646 A1    2/2017
WO        0208771 A1    1/2002

OTHER PUBLICATIONS

English Abstract DE102015113646.
European Search Report for Application No. EP 17 16 2729.

*Primary Examiner* — Dharti H Patel

(74) *Attorney, Agent, or Firm* — Cantor Colburn LLP

(57) ABSTRACT

A monitoring accessory for an electrical apparatus provided with a connection terminal capable of being connected to an electric cable, the monitoring accessory comprising a frame provided with a cooperation system configured to cooperate with the electrical apparatus in a mounted position, a current sensor arranged to measure a current intensity passing through the electric cable, when the electric cable is connected to the connection terminal, the current sensor comprising a measuring portion forming a loop capable of surrounding a section of the electric cable, the measuring portion being provided with a closing system capable of holding the loop in a closed position and forming a passage space for said section of the electric cable inside the loop in the open position.

19 Claims, 2 Drawing Sheets

(51) Int. Cl.
*H02G 15/06* (2006.01)
*G01R 15/18* (2006.01)
*H01R 13/533* (2006.01)
*H01R 13/66* (2006.01)
*H05K 5/02* (2006.01)
*G01K 7/00* (2006.01)

(52) U.S. Cl.
CPC ......... *H01R 13/6683* (2013.01); *H02G 15/06* (2013.01); *H05K 5/0247* (2013.01); *G01K 7/00* (2013.01)

(58) Field of Classification Search
CPC .............. H01R 13/533; H01R 13/6683; H05K 5/0247; G01K 7/00; G01K 13/00
USPC ....................................................... 361/93.8
See application file for complete search history.

(56) References Cited

U.S. PATENT DOCUMENTS

| | | | | |
|---|---|---|---|---|
| 2012/0256617 A1* | 10/2012 | Moreux | ................ | G01R 15/181 324/126 |
| 2014/0103905 A1* | 4/2014 | Johnson | ................ | G01R 15/181 324/127 |
| 2016/0041204 A1* | 2/2016 | Bietz | ..................... | G01R 19/00 324/127 |
| 2016/0061862 A1* | 3/2016 | Nulty | ................... | G01R 15/142 324/127 |
| 2017/0030952 A1 | 2/2017 | Shamir et al. | | |

* cited by examiner

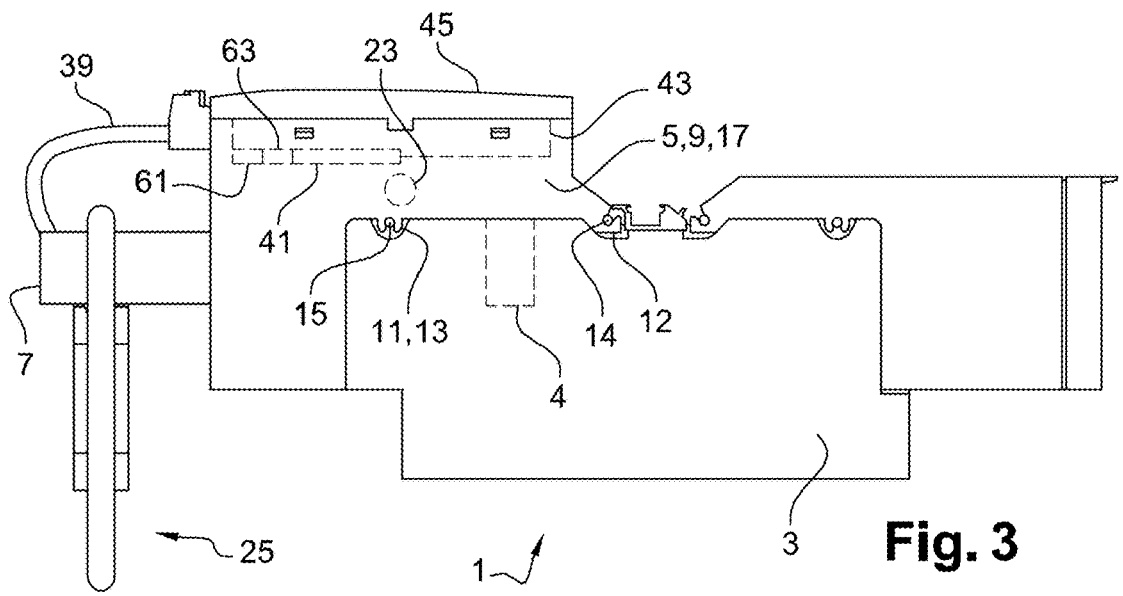
Fig. 3
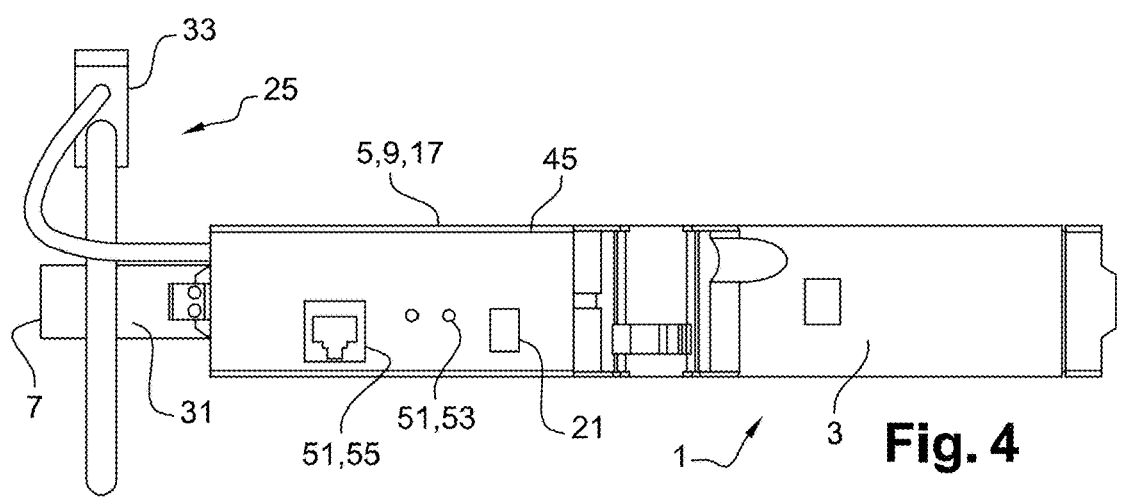
Fig. 4
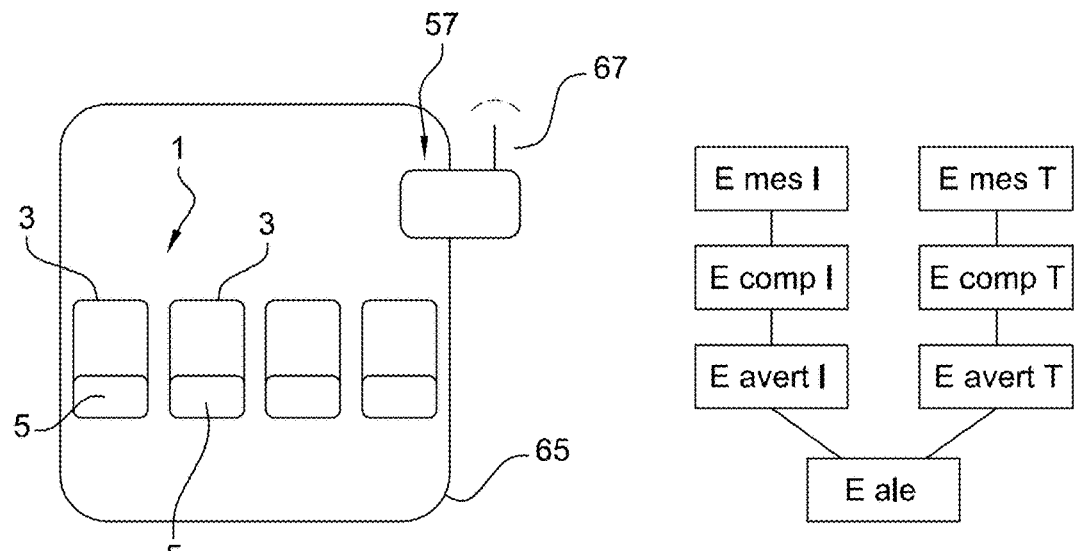
Fig. 5
Fig. 6

MONITORING ACCESSORY FOR AN ELECTRICAL APPARATUS PROVIDED WITH A CONNECTION TERMINAL

CROSS REFERENCE TO RELATED APPLICATIONS

This application claims priority under 35 U.S.C. § 119 to following European Patent application no. EP 17162729.2, filed Mar. 24, 2017, the entire contents of which are incorporated herein by reference thereto.

FIELD OF THE INVENTION

The present invention relates to a monitoring accessory for an electrical apparatus such as a junction block.

PRIOR ART

It is known to ensure the proper operation of an electrical apparatus of the junction block type by measuring a temperature close to a terminal of the electrical apparatus or an intensity passing through an electric cable connected to the terminal.

Some electrical apparatuses or some electric cables require a particular attention because a high intensity and/or temperature may mean that an anomaly or dysfunction is present.

Current measuring devices or temperature measuring devices are known and are used to secure an electrical installation or simply for a preventive maintenance by checking the proper operation state of electrical apparatuses.

However, as these devices are intended for both existing installations and new installations, it may prove to be difficult in practice to quickly and reliably install such devices. It may indeed be necessary to proceed to a long and tedious setting-up.

The present invention aims to solve all or part of the drawbacks mentioned above.

DISCLOSURE OF THE INVENTION

To this end, the present invention concerns a monitoring accessory for an electrical apparatus provided with a connection terminal capable of being connected to an electric cable, the monitoring accessory comprising:
  a frame provided with a cooperation system configured to cooperate with the electrical apparatus in a mounted position,
  a current sensor arranged to measure a current intensity passing through the electric cable, when the electric cable is connected to the connection terminal, the current sensor comprising a measuring portion forming a loop capable of surrounding a section of the electric cable, the measuring portion being provided with a closing system capable of holding the loop in a closed position and forming a passage space for said section of the electric cable inside the loop in the open position.

The monitoring accessory is easy to set up on the electrical apparatus: it is sufficient to dispose the frame on the electrical apparatus and to dispose the loop in the closed position once the measuring portion of the current sensor is disposed around the electric cable.

This arrangement allows avoiding detaching the electric cable from the terminal of the electrical apparatus for the setting-up of the current sensor.

According to an aspect of the invention, the monitoring accessory comprises a temperature sensor arranged to measure a temperature at a determined location relative to the connection terminal.

Therefore, the monitoring accessory is a complete monitoring solution. The temperature and the current are measured to detect any operation anomaly. Furthermore, the installation of the monitoring accessory is quick and reliable, no handling of the electric cable being necessary.

According to an aspect of the invention, the cooperation system comprises at least one hooking element capable of cooperating with the electrical apparatus in a hooked configuration in which the monitoring accessory is capable of pivoting about a hooking axis of the electrical apparatus.

This arrangement allows an easy setting-up since it is sufficient to set up the hooking element then to rotate the monitoring accessory in order to install it on the electrical apparatus.

Preferably, the hooking element is configured to be hooked and unhooked from the electrical apparatus by elastic deformation.

According to an aspect of the invention, the cooperation system comprises at least one snap-fitting element configured to cooperate with a complementary element of the electrical apparatus in the mounted position.

This arrangement allows an easy setting-up and removal of the monitoring accessory without requiring any tool.

According to an aspect of the invention, the cooperation system comprises two hooking elements and/or two snap-fitting elements.

This arrangement allows making a good centering of the frame relative to the electrical apparatus when setting up the monitoring accessory on the electrical apparatus.

According to an aspect of the invention, the frame comprises an outer wall in which an accommodating recess is formed for the electric cable, when the electric cable is connected to the connection terminal.

This arrangement allows, on the one hand, the installation of the monitoring accessory without having to unplug the electric cable and, on the other hand, guiding the portion of the electric cable between the terminal and the outside of the frame.

It is thus easier to set up the current sensor because the position of the portion of the outgoing electric cable from the frame is known.

According to an aspect of the invention, the monitoring accessory comprises a monitoring unit provided with a processor, the monitoring unit being capable of obtaining measured values coming from the temperature sensor and/or the current sensor.

This arrangement allows a local processing of the measured values by the use of a processor or microcontroller. It is therefore possible to provide an autonomous operation of the monitoring accessory.

According to an aspect of the invention, the frame has an inner housing in which the monitoring unit, the frame comprising a closing portion of said inner housing.

This arrangement allows setting up the monitoring unit during the manufacture and also protecting the processing unit during the use of the monitoring accessory.

According to an aspect of the invention, the measuring portion of the current sensor comprises a Rogowski winding.

This arrangement further improves the speed and the reliability of installation since a Rogowski winding has a certain flexibility allowing deforming it during the installation or the removal of the monitoring accessory.

According to an aspect of the invention, the monitoring accessory comprises a linking element of the measuring portion of the current sensor with the frame, the linking element being configured to authorize a displacement of the measuring portion relative to the frame.

Preferably, said displacement is defined in a determined limit. In particular the determined limit depends on a length of the linking element.

This arrangement allows a simple placement of the monitoring accessory in two steps.

First of all, the frame is connected to the electrical apparatus without having to detach the electric cable. The measuring portion is displaced relative to the frame thanks to the linking element which allows a quick setting-up.

Then, once the frame cooperates with the electrical apparatus, the measuring portion may be displaced, split into two at the closing fasteners then installed around the corresponding section of the electric cable.

According to an aspect of the invention, the monitoring accessory comprises a power supply socket or internal battery.

This arrangement allows the operation of the temperature sensor and the current sensor. According to an aspect of the invention the power supply socket is a socket for a 24V, 110 V or 230 V power supply.

Thus, when the electrical apparatus is installed in an electrical box it is possible to use the power supply available in this electrical box for the power supply of the monitoring accessory.

When an internal battery is used, the monitoring accessory is completely independent.

According to an aspect of the invention, the monitoring accessory comprises a warning device arranged to be triggered when at least one value measured by the temperature sensor and/or the current sensor exceeds a corresponding limit value This arrangement allows alerting a user that a dysfunction or an anomaly has been detected by the monitoring accessory.

According to an aspect of the invention, the warning device comprises a display screen capable of displaying at least one value measured by the temperature sensor or the current sensor.

According to an aspect of the invention, the warning device comprises a light element disposed on or formed in the frame.

This arrangement allows visually alerting the user, for example by a red light which may be optionally flashing.

According to an aspect of the invention, the light element comprises at least one light-emitting diode.

According to an aspect of the invention, the monitoring accessory comprises a communication element configured to transmit pieces of information to a remote receiving device.

This arrangement further allows communicating to the receiving device any anomaly or dysfunction detected by the monitoring accessory.

According to an aspect of the invention, a piece of information to the remote receiving device comprises at least one measured value coming from the current sensor and/or the temperature sensor.

According to an aspect of the invention, the communication element comprises a connection socket to a linking cable to the remote receiving device.

This arrangement allows carrying out a wired transmission of pieces of information from the monitoring accessory. When the monitoring accessory is in an electrical box forming a Faraday cage, the wired connection allows communicating with the outside of the box, a communication cable connected to the socket exiting the box by a dedicated opening.

When a box contains several monitoring accessories, the monitoring accessories may be connected to each other via the connection sockets then they may be connected to the receiving device.

According to an aspect of the invention, the communication element further comprises a transmitter configured to transmit pieces of information according to a wireless communication protocol.

This arrangement allows obtaining a feedback of the monitoring accessory without being connected by a wired connection. The supervision is thus facilitated: the user does not have to be in the vicinity of the accessory to be informed of an anomaly or dysfunction.

According to an aspect of the invention, the communication element further comprises a receiver configured to receive pieces of information according to the wireless communication protocol.

This arrangement is interesting when several monitoring accessories are disposed in the same box. Only one of the monitoring accessories may comprise a receiver to receive pieces of information coming from other monitoring accessories.

Pieces of information accordingly centralized might then be transmitted to the receiving device for example by the connection socket.

The present invention also concerns an electrical assembly comprising an electrical apparatus provided with a connection terminal to an electric cable and a monitoring accessory as described above, the monitoring accessory comprising a frame provided with a cooperation system configured to cooperate with the electrical apparatus in a mounted position.

According to an aspect of the invention, the electrical apparatus is a junction block.

According to an aspect of the invention, the junction block is a distribution block that is to say a block comprising an input terminal and at least two output terminals.

According to an aspect of the invention, when the monitoring accessory comprises a communication element, the electrical assembly comprises a receiving device capable of receiving pieces of information from the monitoring accessory.

Preferably, the receiving device is arranged to be formed in an electric box. The receiving device comprises an external pieces of information transfer element, said element being configured to be disposed outside the box.

This arrangement allows gathering at the receiving device pieces of information from the monitoring accessory(ies) located in the box and transferring this pieces of information to a wide area network for example Internet by the use of a wireless module included in the transfer element.

According to the variants, it is possible to define a communication between the monitoring accessories which is of the wired or wireless or partially wired and wireless type.

Similarly, the receiving device may be connected to the monitoring accessories by a wired or wireless connection. Also, the receiving device may be connected to the wide area network by a wired or wireless connection. All combinations of connection types are possible.

The present invention further concerns a supervision method of an electrical apparatus by a monitoring accessory as described above, the electrical apparatus being provided with a connection terminal connected to an electric cable, the supervision method comprising the following steps:

measuring a current intensity passing through the electric cable and obtaining a measured value of the current intensity, comparing the measured value of the current intensity with a current intensity limit value, establishing a warning piece of information of exceedance of a limit value of the current intensity when the measured value of the current intensity is greater than the current intensity limit value.

This arrangement allows systematically recording any measured value which may be considered as referring to an anomaly or dysfunction.

According to an aspect of the invention, the supervision method of an electrical apparatus, further comprising the following steps:

measuring a temperature at a determined location relative to the connection terminal and obtaining a measured value of the temperature, comparing the measured value of the temperature with a temperature limit value, establishing a warning piece of information of exceedance of a limit value of the temperature when the measured value of the current intensity is greater than the current intensity limit value.

According to an aspect of the invention, when a plurality of warning pieces of information of exceedance of a current intensity or temperature limit are established, a step consists in establishing at least one alert piece of information defining a type of anomaly or dysfunction.

Thus, the measured current intensity or temperature values are considered at the same time to determine the type of anomaly or dysfunction.

The different aspects defined above which are not incompatible might be combined.

BRIEF DESCRIPTION OF THE FIGURES

The invention will be better understood using the detailed description which is disclosed below with reference to the appended drawings in which:

FIG. 3 is a side view of the electrical assembly;

FIG. 4 is a top view of the electrical assembly;

FIG. 5 is a schematic view of an electrical box in which a plurality of electrical assemblies is arranged;

FIG. 6 is a diagram of the steps of a supervision method of the electrical apparatus.

DESCRIPTION WITH REFERENCE TO THE FIGURES

In the following detailed description of the figures defined above, the same element or the elements fulfilling identical functions might keep the same references so as to simplify the understanding of the invention.

Figure 1:
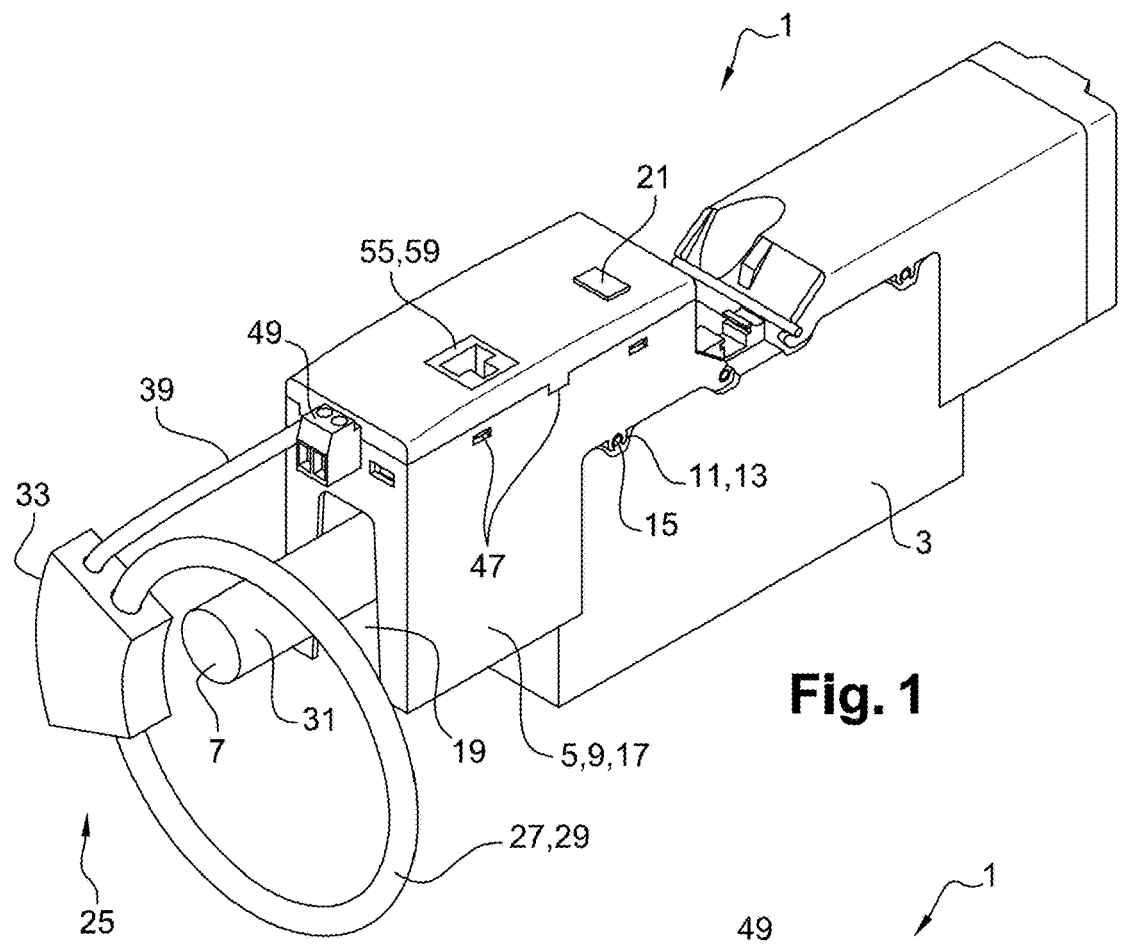
FIG. 1 is a perspective view of an electrical assembly comprising an electrical apparatus and a monitoring accessory.
Figure 2:
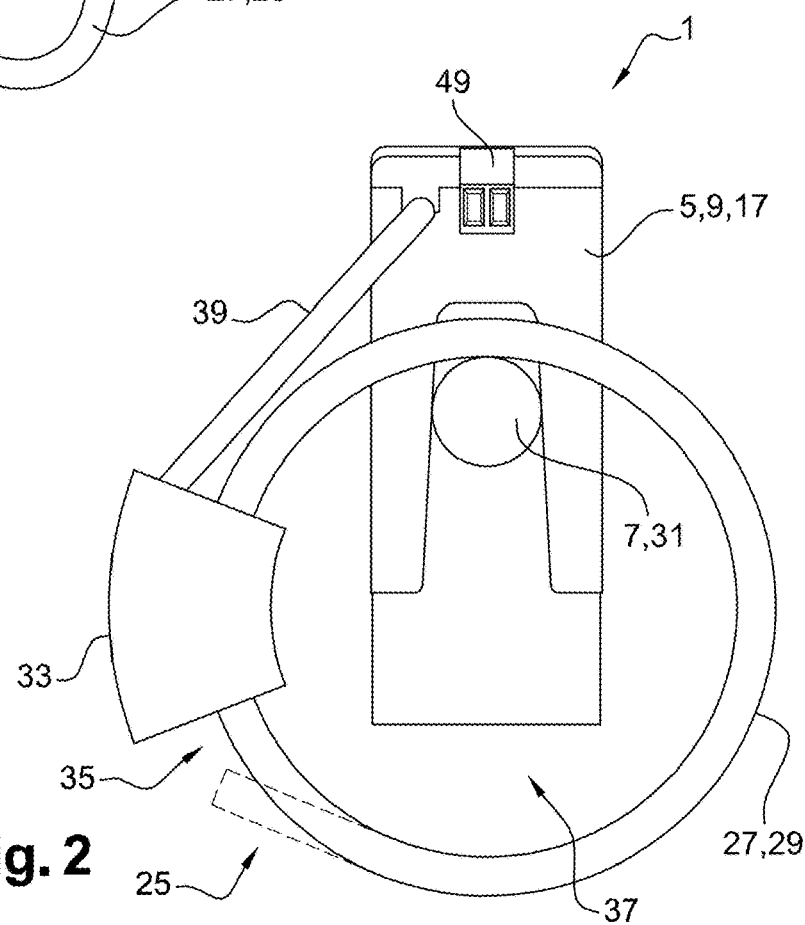
FIG. 2 is a front view of the electrical assembly.

As illustrated in FIG. 1, an electrical assembly 1 comprises an electrical apparatus 3 and a monitoring accessory 5.

In the shown embodiment, the electrical apparatus 3 is a junction block comprising a connection terminal 4 to which a power electric cable 7 is connected. According to a non-shown variant the junction block may be a distribution block.

The monitoring accessory 5 comprises a frame 9 provided with a cooperation system 11 configured to cooperate with the electrical apparatus 3 in a mounted position as shown in FIGS. 1 to 5.

The cooperation system 11 comprises two hooking elements 12 disposed on each side of the frame 9 capable of cooperating with the electrical apparatus 3 in a hooked configuration in which the monitoring accessory 5 is capable of pivoting about a hooking axis 14 of the electrical apparatus 3 as illustrated in FIG. 3.

The hooking elements 12 are configured to be hooked and unhooked from the electrical apparatus 3 by elastic deformation. The cooperation system 11 comprises two snap-fitting elements disposed on each side of the frame 9, each being arranged to cooperate with a complementary element 15 of the electrical apparatus 3 in the mounted position. The frame 9 may thus be disengaged from the electrical apparatus 3 without using any tool.

The frame 9 comprises an outer wall 17 in which an accommodating recess 19 is formed for the electric cable 7 allowing guiding one end portion of the electric cable 7 connected to the connection terminal 4.

The frame 9 comprises an identification label 21 allowing referencing the monitoring accessory 5.

The monitoring accessory 5 comprises a temperature sensor 23 arranged to measure a temperature at a determined location relative to the connection terminal 4 of the electrical apparatus 3.

Thus the measured temperature by the temperature sensor 23 depends directly on the temperature at the connection terminal 4.

The monitoring accessory 5 also comprises a current sensor 25 configured to measure a current passing through the electric cable 7 when the electric cable 7 is connected to the connection terminal 4 as illustrated in FIGS. 1 to 4.

The current sensor 25 is of the Rogowski type, that is to say that it comprises a Rogowski winding 27 surrounding the electric cable 7.

The Rogowski winding 27 is included in a measuring portion 29 of the current sensor 25 forming a loop.

As illustrated in FIGS. 1 to 4, the measuring portion 29 surrounds a section 31 of the electric cable 7, which allows measuring an intensity passing through the electric cable 7.

The measuring portion 29 comprises a closing system 33 arranged to keep the loop formed by the measuring portion 29 in a closed position 10 as illustrated in FIGS. 1 to 4.

The closing system 33 is also configured to be disposed in an open position in which a passage space 35 is formed inside the loop for the electric cable 7.

It is about creating an opening in the loop by disengaging it from the closing system 33 so that the electric cable 7 enters or exits the inside 37 of the loop without detaching the electric cable 7 from the connection terminal 4.

The monitoring accessory 5 also comprises a linking element 39 of the measuring portion 29 to the frame 9. This linking element 39 has some flexibility authorizing a displacement of the measuring portion 29 relative to the frame 9 in a determined limit depending on the length of the linking element 39.

As illustrated in FIG. 3, the monitoring accessory 5 also comprises a monitoring unit 41 provided with a processor. The monitoring unit 41 is disposed in an inner housing 43 of the monitoring accessory 5, the outer wall 17 of the frame 9 being provided with a closing portion 45 of said inner housing 43.

The monitoring accessory 5 is provided with a fastening element 47 to maintain a cooperation between the closing portion 45 and the rest of the frame 9. In the shown embodiment, the fastening element 47 comprises a snap-fitting system. According to another non-shown variant the fastening element 47 may comprise a screw.

The monitoring unit 41 is configured to obtain measured values from the temperature sensor 23 and the current sensor 25. The processor is thus capable of recording the measured values and comparing them with limit values defined beforehand in the memory of the processor. A warning piece of information of exceedance of the intensity or temperature limit value is established by the processor in case of exceedance.

Thus, as illustrated in FIG. 6, a supervision method of the electrical apparatus 3 comprises the steps consisting in:
  measuring E mes I a current intensity passing through the electric cable 7 and obtaining a measured value of the current intensity,
  comparing E comp I the measured value of the current intensity with a current intensity limit value,
  establishing E avert I a warning piece of information of exceedance of a limit value of the current intensity when the measured value of the current intensity is greater than the current intensity limit value.

The same steps of measuring E mes T, comparing E comp T and establishing of a warning piece of information of exceedance of a temperature limit value E avert T are carried out simultaneously.

The processor is capable of processing the warning pieces of information of exceedance of a limit value according to their intensities and their repetition frequencies to establish alert pieces of information E ale defining an anomaly or dysfunction type.

For its power supply, the monitoring accessory 5 comprises a power socket 49 of the 24V power supply type. According to a non-shown variant the monitoring accessory 5 may comprise a battery for the power supply thereof.

The monitoring accessory 5 further comprises a warning device 51 arranged to be triggered and to warn a user when the temperature sensor 23 or the current sensor 25 measures a value beyond a corresponding limit value.

The warning device 51 comprises a light element 53 formed in the frame 9 and arranged to transmit a particular light to signal an exceedance of a limit value, for example a flashing red light.

In the shown embodiment, the warning device comprises two light-emitting diodes.

According to a non-shown variant, the warning device 51 may comprise a display screen configured to display measured values, for example instantaneous values.

The monitoring accessory 5 also comprises a communication element 55 capable of sending alert or warning pieces of information of exceedance of a current intensity or temperature limit value to a receiving device 57 as illustrated in FIG. 5.

The communication element 55 comprises a connection socket 59 to a linking cable to the receiving device 57 or to another monitoring accessory 5.

The communication element 55 may also comprise or in replacement of the connection socket 59 a transmitter 61 and a receiver 63 configured to exchange pieces of information according to a wireless communication protocol such as Bluetooth.

As illustrated in FIG. 5, the electrical assembly 1 may comprise a plurality of electrical devices 3 and monitoring accessories 5 disposed inside an electrical box 65. The receiving device 57 is also formed in the electrical box 65.

The electrical box 65 due to its composition generates a Faraday cage preventing the exchange of pieces of information according to the wireless communication protocol between the inside and the outside of the electrical box 65.

With the electrical assembly 1 shown above several possibilities exist to transmit the pieces of information relating to the measurements of the sensors 23, 25 to an Internet type wide area network via the receiving device 57.

One possibility consists in connecting the monitoring accessories 5 present in the electrical box 65 by linking cables. One of the monitoring accessories 5 is connected by a linking cable to the receiving device 57 to centralize pieces of information coming from all monitoring accessories 5.

As illustrated in FIG. 5, the receiving device 57 comprises an external pieces of information transfer element 67. Said element 67 comprises a wireless module being disposed outside the electrical box 65 which is thus capable of communicating for example by using a local Wifi network.

This arrangement allows gathering at the receiving device 57 the pieces of information coming from the monitoring accessories located in the electrical box 65 and transferring this pieces of information to the wide area network.

Another possibility consists in linking the monitoring accessories 5 by linking cables, one of the monitoring accessories 5 comprising a transmitter 61 and a receiver 63 capable of communicating with the receiving device 57 and the other monitoring accessories 5 inside the electrical box 65.

Another possibility consists in equipping each monitoring accessory 5 with a transmitter 61 and a receiver 63 so that feedback is provided to the receiving device 57 inside the electrical box 65.

The receiving device 57 thus serves as a gateway to communicate the measuring pieces of information to the outside to overcome the problem relating to the Faraday cage generated by the electrical box 65.

The use of monitoring accessory 5 has several advantages.

The setting-up of the monitoring accessory 5 on the electrical apparatus 3 is easy since it is sufficient to snap-fit the frame 9 and then to open the loop of the current sensor 25 in order to close it again around the electric cable 7. The flexibility of the linking element 39 does not bother during the snap-fitting.

The fact of disposing a warning device 51 both visual and communicating allows transmitting any anomaly or dysfunction to a user by using a local network such as Bluetooth or Wifi.

The supervision allowed by the monitoring accessory 5 is therefore complete: the monitoring accessory is therefore suitable for the new electrical installations or existing electrical installations.

Of course, the invention is not limited to the sole embodiment described above by way of example, it encompasses, on the contrary, all the variants.

What is claimed is:

1. An electrical assembly comprising an electrical apparatus provided with a connection terminal to an electric cable and a monitoring accessory, the monitoring accessory comprising:
  a frame provided with a cooperation system configured to cooperate with the electrical apparatus in a mounted position, the cooperation system comprising at least one snap-fitting element configured to cooperate with a complementary element of the electrical apparatus in the mounted position, a current sensor arranged to measure a current intensity passing through the electric cable, when the electric cable is connected to the connection terminal, the current sensor comprising a measuring portion forming a loop capable of surrounding a section of the electric cable, the measuring portion being provided with a closing system capable of holding the loop in a closed position and of forming a passage space for said section of the electric cable inside the loop in an open position.

2. The electrical assembly according to claim 1, wherein the monitoring accessory further comprises a temperature sensor arranged to measure a temperature at a determined location relative to the connection terminal.

3. The electrical assembly according to claim 2, wherein the monitoring accessory further comprises a monitoring unit provided with a processor, the monitoring unit being capable of obtaining measured values coming from the temperature sensor and/or the current sensor.

4. The electrical assembly according to claim 3, wherein the frame has an inner housing in which the monitoring unit is disposed, the frame comprises a closing portion of said inner housing.

5. The electrical assembly according to claim 2, wherein the measuring portion of the current sensor comprises a Rogowski winding.

6. The electrical assembly according to claim 2, wherein the monitoring accessory further comprises a monitoring unit provided with a processor, the monitoring unit being capable of obtaining measured values coming from the temperature sensor and/or the current sensor.

7. The electrical assembly according to claim 6, wherein the frame has an inner housing in which the monitoring unit is disposed, the frame comprises a closing portion of said inner housing.

8. The electrical assembly according to claim 7, wherein the measuring portion of the current sensor comprises a Rogowski winding.

9. The electrical assembly according to claim 6, wherein the measuring portion of the current sensor comprises a Rogowski winding.

10. The electrical assembly according to claim 1, wherein the measuring portion of the current sensor comprises a Rogowski winding.

11. The electrical assembly according to claim 1, wherein the monitoring accessory further comprises a linking element of the measuring portion of the current sensor with the frame, the linking element being configured to allow a displacement of the measuring portion relative to the frame.

12. The electrical assembly according to claim 2, wherein the monitoring accessory further comprises a warning device arranged to be triggered when at least one value measured by the temperature sensor and/or the current sensor exceeds a corresponding limit value.

13. The electrical assembly according to claim 12, wherein the warning device comprises a light element disposed on or formed in the frame.

14. The electrical assembly according to claim 1, wherein the monitoring accessory further comprises a communication element configured to transmit pieces of information to a remote receiver device.

15. The electrical assembly according to claim 14, wherein the communication element comprises a connection socket to a linking cable to the remote receiver device.

16. The electrical assembly according to claim 14, wherein the communication element further comprises a transmitter configured to transmit pieces of information according to a wireless communication protocol.

17. The electrical assembly according to claim 16, wherein the communication element further comprises a receiver configured to receive pieces of information according to the wireless communication protocol.

18. A supervision method of an electrical apparatus by an electrical assembly according to claim 1, the electrical apparatus being provided with a connection terminal connected to an electric cable, the supervision method comprising the following steps:
- (E mes I) measuring a current intensity passing through the electric cable and obtaining a measured value of the current intensity,
- (E comp I) comparing the measured value of the current intensity with a current intensity limit value,
- (E avert I) establishing a warning piece of information of exceedance of a limit value of the current intensity when the measured value of the current intensity is greater than the current intensity limit value.

19. The supervision method of an electrical apparatus according to claim 18, further comprising the following steps:
- (E mes T) measuring a temperature at a determined location relative to the connection terminal and obtaining a measured value of the temperature,
- (E comp T) comparing the measured value of the temperature with a temperature limit value,
- (E avert T) establishing a warning piece of information of exceedance of a limit value of the temperature when the measured value of the current intensity is greater than the current intensity limit value.

* * * * *